United States Patent
Kifune et al.

(10) Patent No.: US 10,908,994 B2
(45) Date of Patent: Feb. 2, 2021

(54) MEMORY SYSTEM AND METHOD OF CONTROLLING NONVOLATILE MEMORY

(71) Applicant: TOSHIBA MEMORY CORPORATION, Minato-ku (JP)

(72) Inventors: Naoko Kifune, Yokohama (JP); Hironori Uchikawa, Fujisawa (JP); Takahiro Fujiki, Kawasaki (JP); Daiki Watanabe, Yokohama (JP); Daisuke Fujiwara, Yokohama (JP); Kosuke Morinaga, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/541,269

(22) Filed: Aug. 15, 2019

(65) Prior Publication Data
US 2020/0301777 A1    Sep. 24, 2020

(30) Foreign Application Priority Data
Mar. 19, 2019 (JP) .................. 2019-051045

(51) Int. Cl.
*G06F 11/10* (2006.01)
*G11C 29/52* (2006.01)
*H03M 13/45* (2006.01)

(52) U.S. Cl.
CPC .......... *G06F 11/1068* (2013.01); *G11C 29/52* (2013.01); *H03M 13/45* (2013.01)

(58) Field of Classification Search
CPC ..... G06F 11/1068; G11C 29/52; H03M 13/45
See application file for complete search history.

(56) References Cited

U.S. PATENT DOCUMENTS 9,954,558 B1 * 4/2018 Steiner ............... G11C 11/5642
2010/0058152 A1   3/2010 Harada
(Continued)

FOREIGN PATENT DOCUMENTS

JP     4599625 B2     12/2010
JP     2014-140111 A   7/2014

OTHER PUBLICATIONS

S. Jeon, E. Hwang, B. V. K. V. Kumar and M. K. Cheng, "LDPC Codes for Memory Systems with Scrubbing," 2010 IEEE Global Telecommunications Conference GLOBECOM 2010, Miami, FL, 2010, pp. 1-6. (Year: 2010).*

*Primary Examiner* — Kyle Vallecillo
(74) *Attorney, Agent, or Firm* — Oblon, McClelland, Maier & Neustadt, L.L.P.

(57) ABSTRACT

A memory system in an embodiment includes a nonvolatile memory and a memory controller. The memory stores a multi-dimensional error correction code including at least one symbol that is capable of being protected by at least a first and a second component code. The controller reads the error correction code from the memory, executes hard decision decoding of the first component code with respect to the read error correction code and outputs a first decoding result and index information for calculating likelihood of the first decoding result, executes, when the hard decision decoding fails, soft decision decoding of the second component code by using the first decoding result and the index information and outputs a decoding result as a hard bit, and, executes, when the soft decision decoding fails, the hard decision decoding with respect to the result of the soft decision decoding output.

20 Claims, 10 Drawing Sheets

(56) References Cited

U.S. PATENT DOCUMENTS

| | | | |
|---|---|---|---|
| 2014/0208182 A1 | 7/2014 | Sakai et al. | |
| 2015/0169406 A1* | 6/2015 | Li | G06F 11/1012 |
| | | | 714/763 |
| 2016/0006458 A1* | 1/2016 | Li | H03M 13/1117 |
| | | | 714/760 |
| 2016/0246673 A1* | 8/2016 | Kim | H03M 13/1575 |
| 2016/0247576 A1* | 8/2016 | Park | G11C 29/42 |
| 2016/0266968 A1* | 9/2016 | Torii | G06F 11/1012 |
| 2016/0266972 A1* | 9/2016 | Yamaki | H03M 13/3746 |
| 2017/0257122 A1* | 9/2017 | Torii | H03M 13/3707 |
| 2018/0341543 A1* | 11/2018 | Ha | H03M 13/3707 |
| 2019/0295659 A1* | 9/2019 | Hong | G06F 11/1012 |

\* cited by examiner

| HB | SB1 | SB2 | SB3 | SB4 | LLR |
|---|---|---|---|---|---|
| 0 | 0 | 0 | 0 | 0 | -127 |
| ... | ... | ... | ... | ... | ... |
| 0 | 1 | 0 | 0 | 0 | -50 |
| 0 | 1 | 0 | 0 | 1 | -30 |
| 0 | 1 | 0 | 1 | 0 | -30 |
| 0 | 1 | 0 | 1 | 1 | -10 |
| ... | ... | ... | ... | ... | ... |
| 1 | 1 | 1 | 1 | 1 | 127 |

FIG.7

| ber\N | 10 | 15 | 20 | 25 | 30 |
|---|---|---|---|---|---|
| 0.001 | 11.09894468 | 9.91332101 | 9.066023149 | 8.406162 | 7.865628166 |
| 0.002 | 9.710647309 | 8.525023644 | 7.677725783 | 7.017865 | 6.4773308 |
| 0.003 | 8.89771208 | 7.712088415 | 6.864790554 | 6.204929 | 5.664395571 |
| 0.004 | 8.320340911 | 7.134717245 | 6.287419385 | 5.627558 | 5.087024402 |
| 0.005 | 7.872044767 | 6.686421102 | 5.839123241 | 5.179262 | 4.638728258 |
| 0.006 | 7.505390593 | 6.319766927 | 5.472469067 | 4.812608 | 4.272074084 |
| 0.007 | 7.195076148 | 6.009452482 | 5.162154622 | 4.502293 | 3.961759639 |
| 0.008 | 6.925998249 | 5.740374583 | 4.893076723 | 4.233216 | 3.69268174 |
| 0.009 | 6.688415032 | 5.502791366 | 4.655493506 | 3.995632 | 3.455098523 |
| 0.01 | 6.475674818 | 5.290051152 | 4.442753292 | 3.782892 | 3.242358309 |
| 0.0125 | 6.024330823 | 4.838707157 | 3.991409297 | 3.331548 | 2.791014314 |

MEMORY SYSTEM AND METHOD OF CONTROLLING NONVOLATILE MEMORY

CROSS-REFERENCE TO RELATED APPLICATIONS

This application is based upon and claims the benefit of priority from Japanese Patent Application No. 2019-051045, filed on Mar. 19, 2019; the entire contents of which are incorporated herein by reference.

FIELD

Embodiments described herein relate generally to a memory system.

BACKGROUND

Generally, in a memory system, error-correction encoded data red in order to protect data to be stored. Therefore, in a case where data stored on the memory system is read, error-correction encoded data is decoded.

BRIEF DESCRIPTION OF THE DRAWINGS

FIG. 7 illustrates examples of calculation results of absolute values of LLRs;

DETAILED DESCRIPTION

A memory system in one embodiment includes a nonvolatile memory and a memory controller. The nonvolatile memory stores a multi-dimensional error correction code including at least one symbol that is capable of being protected by at least a first component code and a second component code. The memory controller reads the error correction code from the nonvolatile memory, executes hard decision decoding of the first component code with respect to the read error correction code, outputs a first decoding result and index information for calculating likelihood of the first decoding result, executes, in a case where the hard decision decoding fails, soft decision decoding of the second component code by using the first decoding result and the index information and outputs a decoding result as a hard bit, and executes, in a case where the soft decision decoding fails, hard decision decoding with respect to the result of the soft decision decoding output as the hard bit.

Hereinafter, memory systems according to embodiments will be described in detail with reference to the attached drawings. Note that the present invention is not limited by the following embodiments.

First Embodiment

Figure 1:
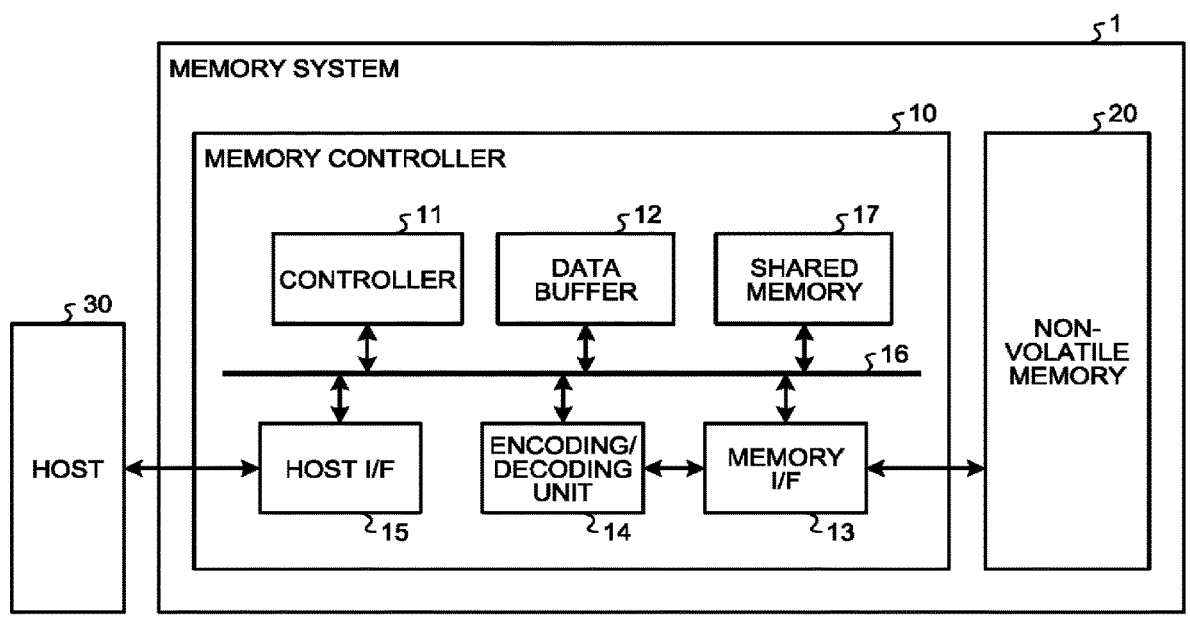
FIG. 1 is a block diagram illustrating a schematic configuration example of a memory system according to a first embodiment.

FIG. 1 is a block diagram illustrating a schematic configuration example of a memory system according to a first embodiment. As illustrated in FIG. 1, a memory system 1 includes a memory controller 10 and a nonvolatile memory 20. The memory system 1 is connectable to a host 30, and FIG. 1 illustrates a state in which the memory system 1 is connected to the host 30. The host 30 may be, for example, an electronic device such as a personal computer or a mobile terminal.

The nonvolatile memory 20 is a nonvolatile memory that stores data in a nonvolatile manner and is, for example, a NAND flash memory (hereinafter, simply referred to as "NAND memory"). In the following description, a case where a NAND memory is used as the nonvolatile memory 20 will be exemplified. It is also possible to use storage devices other than the NAND memory as the nonvolatile memory 20, such as a three-dimensional structure flash memory, a resistance random access memory (ReRAM), and a ferroelectric random access memory (FeRAM). Further, it is not essential that the nonvolatile memory 20 be a semiconductor memory, and it is also possible to apply this embodiment to various storage media other than the semiconductor memory.

The memory system 1 may be a memory card or the like including the memory controller 10 and the nonvolatile memory 20 as a single package or may be a solid state drive (SSD) or the like.

The memory controller 10 is a semiconductor integrated circuit configured as, for example, a system-on-a-chip (SoC). Part of or the whole operation of each constituent member of the memory controller 10 described below may be achieved by a central processing unit (CPU) executing firmware or may be achieved by hardware.

The memory controller 10 controls writing to the nonvolatile memory 20 in response to a write request from the host 30. Further, the memory controller 10 controls reading from the nonvolatile memory 20 in response to a read request from the host 30. The memory controller 10 includes a host interface (host I/F) 15, a memory interface (memory I/F) 13, a controller 11, an encoding/decoding unit (codec) 14, a data buffer 12, and a shared memory 17. The host I/F 15, the memory I/F 13, the controller 11, the encoding/decoding unit 14, the data buffer 12, and the shared memory 17 are connected to each other via an internal bus 16.

The host I/F 15 executes a process conforming to an interface standard between the host I/F 15 and the host 30 and outputs a request received from the host 30, user data to be written, and the like to the internal bus 16. Further, the host I/F 15 transmits user data read from the nonvolatile memory 20 and then restored, a response from the controller 11, and the like to the host 30.

The memory I/F 13 performs a process of writing to the nonvolatile memory 20 on the basis of an instruction from the controller 11. Further, the memory I/F 13 performs a process of reading from the nonvolatile memory 20 on the basis of an instruction from the controller 11.

The data buffer 12 temporarily stores user data that the memory controller 10 receives from the host 30 until the user data is stored on the nonvolatile memory 20. Further, the data buffer 12 temporarily stores user data read from the nonvolatile memory 20 until the user data is transmitted to the host 30. The data buffer 12 can be, for example, a general memory such as a static random access memory (SRAM) or a dynamic random access memory (DRAM).

The controller 11 comprehensively controls constituent members of the memory system 1. In a case where the controller 11 receives a request from the host 30 via the host I/F 15, the controller 11 performs control in response to the request. For example, in response to a write request from the host 30, the controller 11 instructs the memory I/F 13 to write user data and parity to the nonvolatile memory 20. Further, in response to a read request from the host 30, the controller 11 instructs the memory I/F 13 to read user data and parity from the nonvolatile memory 20.

Further, in a case where the controller 11 receives a write request of user data from the host 30, the controller 11 determines a storage area (memory area) in the nonvolatile memory 20 for user data accumulated in the data buffer 12. That is, the controller 11 manages a writing destination of the user data. A correspondence between a logical address of user data received from the host 30 and a physical address indicating a storage area in the nonvolatile memory 20 on which the user data is stored is stored on, for example, the data buffer 12 as an address translation table.

Further, in a case where the controller 11 receives a read request from the host 30, the controller 11 translates a logical address specified by the read request to a physical address by using the above-mentioned address translation table and instructs the memory I/F 13 to perform reading from the physical address.

Herein, in the NAND memory, generally, writing and reading are performed in a data unit referred to as "page" and deletion is performed in a data unit referred to as "block". In this embodiment, a plurality of memory cells connected to the same word line is referred to as "memory cell group". In a case where each memory cell is a single level cell (SLC), a single memory cell group corresponds to a page. In a case where each memory cell is a multi-level cell (MLC), a single memory cell group corresponds to a plurality of pages. Further, each memory cell is connected not only to a word line hut also to a bit line. Therefore, each memory cell can be identified by using an address for identifying a word line and an address for identifying a bit line.

For example, in a case where a memory cell is a two-bit/cell memory cell, a data value of each of two bits is associated with four threshold distributions of Er, A, B, and C levels. This correspondence is referred to as "data coding". Data coding is determined in advance. At the time of writing (programming) data, electric charges are injected to the memory cells so that the memory cells have levels (threshold distributions) corresponding to data values to be stored in accordance with data coding. Further, in a case where the two-bit/cell is used, a single memory cell group corresponds to two pages. Two bits that each memory cell can store correspond to two pages, respectively. Hereinafter, the two pages are referred to as "lower page" and "upper page".

User data transmitted from the host 30 is transferred to the internal bus 16 and is temporarily stored on the data buffer 12. The encoding/decoding unit 14 encodes user data to be stored on the nonvolatile memory 20, thereby generating encoded data (code word). Further, the encoding/decoding unit 14 decodes encoded data read from the nonvolatile memory 20 (referred also as "read information" or "received word"), thereby restoring the encoded data to user data. Note that data encoded by the encoding/decoding unit 14 may include not only user data but also control data used inside the memory controller 10 and the like.

In a writing process in the memory system 1 having the above-mentioned configuration, the controller 11 instructs the encoding/decoding unit 14 to encode user data when the user data is written to the nonvolatile memory 20. At this time, the controller 11 determines a storage location (storage address) of a code word in the nonvolatile memory 20 and instructs the memory I/F 13 to store the code word in the determined storage location. The encoding/decoding unit 14 encodes the user data in the data buffer 12 to generate a code word on the basis of the instruction from the controller 11. An encoding method can be, for example, an encoding method using a low-density parity-check (LDPC) code, a Dose-Chaudhuri-Hocquenghem (BCH) code, or a Reed-Solomon (RS) code.

Meanwhile, in a reading process, at the time of reading from the nonvolatile memory 20, the controller 11 specifies an address in the nonvolatile memory 20 and instructs the memory I/F 13 to perform reading. Further, the controller 11 instructs the coding/decoding unit 14 to start decoding. The memory I/F 13 executes reading from the specified address in the nonvolatile memory 20 in accordance with the instruction from the controller 11 and inputs read information obtained by this reading to the encoding/decoding unit 14. Then, the encoding/decoding unit 14 decodes the input read information.

The encoding/decoding unit 14 can also be used as, for example, an encoder/decoder of each component code of a multi-dimensional error correction code. A multi-dimensional error correction code indicates a code including at least one or more symbols serving as units constituting the error correction code that are protected by a plurality of smaller component codes in a multiplex manner. At this time, a symbol includes, for example, elements of alphabets of one bit (elements of a binary field), a finite field other than the binary field, or the like.

Figure 2:
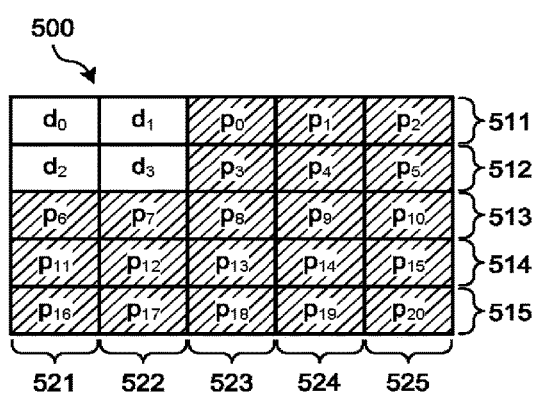
FIG. 2 illustrates an example of a multi-dimensional error correction code according to the first embodiment.

Herein, FIG. 2 illustrates a configuration example of a product code as an example of a multi-dimensional error correction code. A product code 500 illustrated in FIG. 2 has a structure in which information bits (which may be symbols) $d_0$ to $d_3$ are protected by hamming codes 511 to 515 and 521 to 525 having an information length of two bits and a parity length of three bits in a row direction (lateral direction in the drawing) and a column direction (longitudinal direction in the drawing), respectively. In such a product code 500, all information bits $d_0$ to $d_3$ and parity bits $p_0$ to $p_{20}$ are doubly protected by the hamming codes 511 to 515 in the row direction (also referred to as "dimension 1") and the hamming codes 521 to 525 in the column direction (also referred to as "dimension 2"). One of two component codes included in the product code is the hamming codes 511 to 515, and the other one is the hamming codes 521 to 525.

In decoding of the product code in FIG. 2, first, for example, the encoding/decoding unit 14 successively decodes the hamming codes 511 to 515 in the dimension 1 included in the product code. In a case where there is a hamming code that is not successfully decoded among the hamming codes 511 to 515 in the dimension 1, the encoding/decoding unit 14 corrects an error that can be corrected in the decoding of the hamming codes 511 to 515 in the dimension 1 and decodes the hamming codes 521 to 525 in the dimension 2. In a case where there is a hamming code that is not successfully decoded among the hamming codes 521 to 525 in the dimension 2, the encoding/decoding unit 14 corrects an error that can be corrected in the decoding of the hamming codes 521 to 525 in the dimension 2 and decodes the hamming codes 511 to 515 in the dimension 1 again. As described above, decoding of the hamming codes 511 to 515 in the dimension 1 and decoding of the hamming codes 521 to 525 in the dimension 2 are repeatedly executed until a termination condition is satisfied. Hereinafter, the decoding repeated as described above is referred to as "repetition decoding process" in some cases. The product code is used to achieve an encoding method having a high correction ability and low computational complexity.

Note that a multi-dimensional error correction code is not limited to the product code 500 exemplified in FIG. 2 and may be, for example, a generalized low density parity check code (generalized LDPC code) or the like. In a general multi-dimensional error correction code including a generalized LDPC code, multiplexity of protection may differ between symbols. Further, in a general multi-dimensional error correction code, component codes cannot be grouped into the dimensions 1 and 2. However, the present technology is also applicable to a multi-dimensional error correction code having such a code structure. Hereinafter, an example where a product code is used as a multi-dimensional error correction code will be described.

In this embodiment, one of decoding processes of two component codes included in a repetition decoding process of a product code is hard decision decoding, and the other one is soft decision decoding. Hard decision decoding is a decoding method in which only binary information of one bit of "0" or "1" read from the nonvolatile memory 20 is used as input, an error is corrected by using a redundant bit referred to as "parity", and the binary information of the one bit of "0" or "1" is output. In soft decision decoding, information indicating a probability that a value of each bit stored on the nonvolatile memory 20 is "0" is used as input (received word). Further, in soft decision decoding, for example, decision (posteriori value hard decision) is executed on the basis of a probability that each decoded bit is "0", and binary information of one bit of "0" or "1" is output.

In repetition decoding in the memory system 1 according to this embodiment, data to which a decoding result of hard decision decoding is reflected is used as input of soft decision decoding in repeated decoding processes other than a first decoding process. In this embodiment, not only a decoding result of hard decision decoding (binary information of one bit) but also information for calculating likelihood of the decoding on the basis of the decoding result is obtained, and the obtained information is also reflected to input of soft decision decoding. The likelihood of the decoding is indicated by, for example, a log likelihood ratio (LLR). The information for calculating the likelihood (LLR) of the decoding is, for example, index information of a table (LLR table) for obtaining an LLR.

Figure 3:
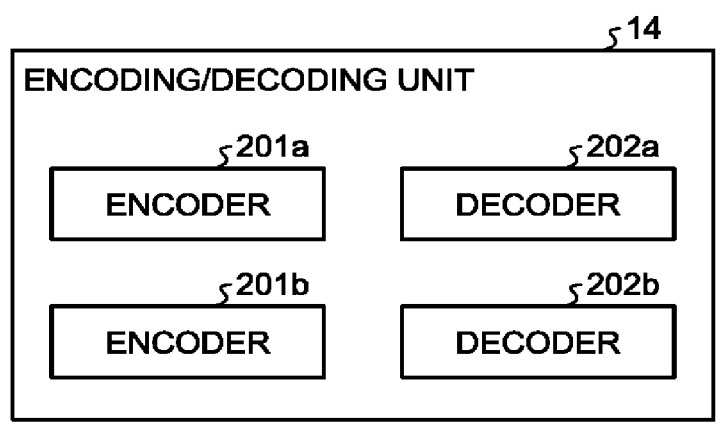
FIG. 3 is a block diagram illustrating an example of a functional configuration of an encoding/decoding unit according to the first embodiment.

FIG. 3 is a block diagram illustrating an example of a functional configuration of the encoding/decoding unit 14. FIG. 3 illustrates an example where the two-dimensional product code illustrated in FIG. 2 is encoded/decoded. Hereinafter, the two-dimensional error correction code will be mainly described as an example. However, a similar method is applicable to an N-dimensional (N represents an integer of two or more) error correction code.

As illustrated in FIG. 3, the encoding/decoding unit 14 includes encoders 202a and 201b and decoders 202a and 202b. The encoders 201a and 201b encode component codes in the dimensions 1 and 2, respectively. The decoders 202a and 202b decode component codes in the dimensions 1 and 2, respectively. Hereinafter, description will be made on the assumption that the decoder 202a performs hard decision decoding of a component code (first component code) in the dimension 1 and the decoder 202b performs soft decision decoding of a component code (second component code) in the dimension 2.

The shared memory 17 in FIG. 2 stores data referred to in encoding performed by the encoders 201a and 201b and decoding performed by the decoders 202a and 202b. The shared memory 17 stores, for example, each piece of input data that is used when an n-dimensional (n is an integer of 1 or more but N or less) error correction code is decoded in an m-th (m is an integer of 1 or more) decoding process of the decoders 202a and 202b. Further, the shared memory 17 stores each piece of output data serving as a decoding result of the n-dimensional error correction code in the m-th decoding process. The shared memory 17 may be provided inside the encoding/decoding unit 14.

Figure 4:
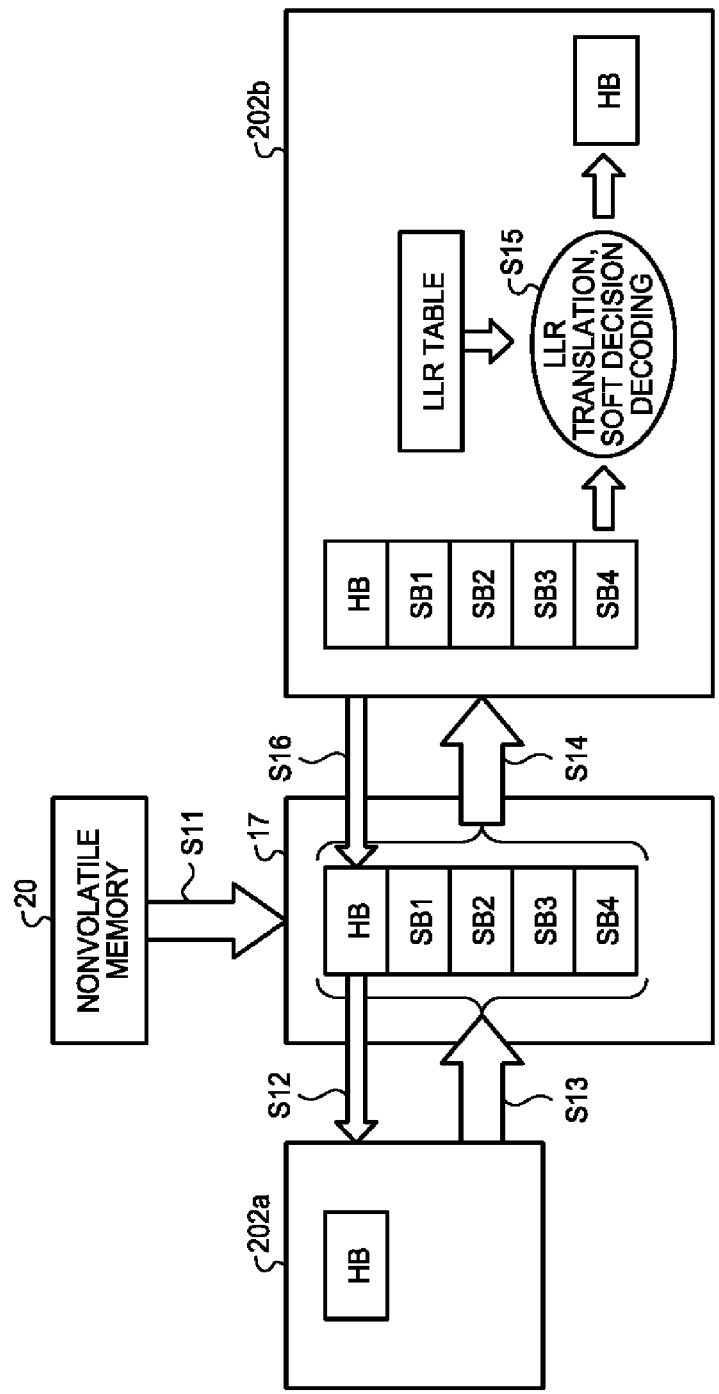
FIG. 4 illustrates an overview of a repetition decoding process according to the first embodiment.

FIG. 4 illustrates an overview of the repetition decoding process according to this embodiment. The repetition decoding process is a process in which decoding processes are repeatedly performed by the decoders 202a and 202b. Data to be decoded, which is read from the nonvolatile memory 20 via the memory I/F 13, is stored on the shared memory 17 (Step S11). The decoder 202a and the decoder 202b each can access the shared memory 17.

In a case where data is read from the nonvolatile memory 20, whether data in a memory cell is "1" or "0" is determined on the basis of whether current flows through the memory cell when a certain reading voltage is applied thereto. In this embodiment, the decoder 202b performs soft decision decoding by using likelihood (likelihood information) of the read data. Therefore, the memory controller 10 executes reading from the nonvolatile memory 20 by soft-bit read. The soft-bit read is a method of reading data by using a reading voltage (reference reading voltage) serving as a reference of determination of a bit value and a plurality of reading voltages shifted toward lower and higher sides from the reference reading voltage by a given value ($\Delta R$).

Hereinafter, there will be described an example where a reference reading voltage and six reading voltages shifted from the reference reading voltage by $\pm \Delta R$, $\pm 2\Delta R$, and $\pm 3\Delta R$ are used. The number of reading voltages shifted from the reference reading voltage is not limited thereto. Further, hereinafter, for example, a reading result obtained by using the reading voltage shifted from the reference reading voltage by $+\Delta R$ is referred to as "reading result of $+\Delta R$" in some cases. The same applies to $-\Delta R$, $\pm 2\Delta R$, and $+3\Delta R$.

Hereinafter, a bit value indicating "1" or "0" read by using the reference reading voltage is referred to as "HB" (hard bit). As illustrated in FIG. 4, the shared memory 17 stores the HB together with soft bits SB1 to SB4. Each soft bit is, for example, a value of one bit calculated as follows. Note that the following is an example where data is read from a lower page of a three-bit/cell memory cell. In a case where data is read from another memory cell or another page, soft bits that are appropriately determined therefor may be stored. The number of soft bits is not limited to four.

The SB1 is XNOR of a reading result $+\Delta 2R$ and a reading result of $-\Delta 2R$. The SB2 is XNOR of XNOR2 and $+\Delta R$ when XNOR of $-\Delta 3R$ and $+3\Delta R$ is XNOR1 and XNOR of XNOR1 and −ΔR is XNOR2. The SB3 is a reading result of an HB on a middle page. The SB4 is a reading result of an HB on an upper page.

The soft bits (SB1 to SB4) correspond to index information for calculating likelihood (LLR) of decoding. Hereinafter, this index information is referred to as "SB indexes". An LLR is determined by using the HB and the SB indexes as an index. For example, the decoder 202b acquires an HB and SB indexes (SB1 to SB4) written in the shared memory 17 and calculates likelihood (LLR) of decoding on the basis of a value of each acquired bit. For example, the decoder 202b calculates the LLR by using an LLR table determined in advance. The LLR table is information (correspondence information) in which an index including an HB and SB indexes and an LLR are associated with each other.

Figures 5, 6:
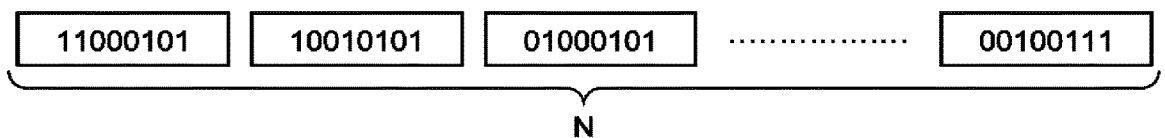
FIG. 5 illustrates an example of an LLR table.
FIG. 6 illustrates an example of an RS code in which 8 bits constitute a symbol.

FIG. 5 illustrates an example of the LLR table. As illustrated in FIG. 5, a value of an LLR is associated with each index including an HB and SB indexes (SB1 to SB4) in the LLR table. In a case where the HB and the SB1 to SB4, i.e., 5 bits in total are used as in the example illustrated in FIG. 4, indexes of the LLR table can be $2^5=32$ types at the maximum. It is unnecessary to use all the 32 types of indexes, and there may be an unused index.

In some cases, the LLR table used by the decoder 202b is determined in advance by a vendor of the memory system 1 for, for example, soft decision decoding that is used without being combined with a product code. In this embodiment, in a case where there is an unused index in the LLR table determined in advance, the LLR table is corrected by the vendor of the memory system 1 so as to use the unused index as an index for the decoder 202a, and the corrected LLR table is used. The index for the decoder 202a indicates an index with which the decoder 202b can calculate an LLR indicating likelihood of decoding performed by the decoder 202a (hereinafter, referred to as "LLR of the decoder 202a" in some cases). In a case where there is no unused index or in other cases, an index with which the decoder 202b can calculate a value closest to the LLR of the decoder 202a may be used among the indexes in the LLR table determined in advance.

Referring back to FIG. 4, the decoder 202a inputs an HB (binary information of one bit of "0" or "1") written in the shared memory 17 and executes hard decision decoding (Step S12). In this embodiment, the decoder 202a determines SB indexes on the basis not only the HB obtained by hard decision decoding but also a state of decoding (error correction) performed by the decoder 202a and writes (overwrites) the determined SB indexes to the shared memory 17 (Step S13). The state of decoding is, for example, the number of correction bits. The decoder 202a determines, as the SB indexes based on the state of decoding, values with which an LLR based on the state of decoding is calculated.

The HB and the SB indexes written by the decoder 202a are used in the next soft decision decoding performed by the decoder 202b (Step S14). That is, the decoder 202b can execute soft decision decoding by using not only the HB hut also the SB indexes that are changed on the basis of a state of hard decision decoding performed by the decoder 202a. This makes it possible to improve accuracy of soft decision decoding.

The decoder 202b translates the HB and the SB indexes written by the decoder 202a into an LLR by using the LLR table (Step S15). The decoder 202b executes decision (posteriori value hard decision) as to whether the read data is "0" or "1" by using the obtained LLR and writes (overwrites) binary information of one bit as a decoding result HB of soft decision decoding to the shared memory 17 (Step S16).

A specific example of a procedure for determining SB indexes on the basis of a state of hard decision decoding will be described below. The following is an example where the number of correction bits is used as a state of hard decision decoding.

The decoder 202a decodes a certain code word and obtains a code word Y serving as a decoding result. Further, the number of correction bits t, which is used when the code word Y is obtained, is α. An LLR of the i-th bit is calculated by the following expression (1).

$$LLR(b_i)=\log(P(b_i=0|Y_{t=\alpha})/P(b_i=1|Y_{t=\alpha})) \quad (1)$$

$P(b_i=0|Y_{t=\alpha})$ denotes a probability (likelihood) that the i-th bit is "0" when the number of correction bits t is α. $P(b_i=1|Y_{t=\alpha})$ denotes a probability (likelihood) that the i-th bit is "1" when the number of correction bits t is α. In a case where a value of the LLR is positive, a probability that bit data is "0" is high, and, in a case where the value of the LLR is negative, a probability that the bit data is "1" is high. Further, an absolute value of the LLR indicates reliability of the bit data. The larger the absolute value of the LLR is, the higher the reliability is, and the smaller the absolute value of the LLR is, the lower the reliability is.

The symbol $b_i$ is a bit determined as "0" by decoding performed by the decoder 202a. $P(b_i=0|Y_{t=\alpha})$ can be deformed as in the following expressions (2) and (3) under the following condition: a probability of determining that, when a transmission word (data input to the decoder 202a) is X, the bit (i-th bit) has the same value as the transmission word X although the bit is different from the transmission word X is negligibly lower than a probability that correct decoding is performed (for example, under the condition of α=1).

$$P(b_i=0|Y_{t=\alpha})=P(b_i=0, X=Y_{t=\alpha}|Y_{t=\alpha})+P(b_i=0, X\neq Y_{t=\alpha}|Y_{t=\alpha}) \quad (2)$$

$$P(b_i=0|Y_{t=\alpha})\approx P(b_i=0, X=Y_{t=\alpha}|Y_{t=\alpha}) \quad (3)$$

A probability of determining that the bit (i-th bit) is "1" when correction is correctly performed is 0, and therefore $P(b_i=1|Y_{t=\alpha})$ can be deformed as in the following expression (4).

$$P(b_i=1|Y_{t=\alpha}) = P(b_i=1, X=Y_{t=\alpha}|Y_{t=\alpha}) + P(b_i=1, X\neq Y_{t=\alpha}|Y_{t=\alpha}) = \quad (4)$$
$$P(b_i=1, X\neq Y_{t=\alpha}|Y_{t=\alpha})$$

In a case where the expression (3) is used, an antilogarithm of log in the expression (1) is expressed by a ratio of a probability that the correction correct to a probability that the correction is wrong (error correction). When a second term on a right side in the expression (2) cannot be omitted, i.e., in a region in which the probability that the correction is correct and the probability that the correction is error correction have substantially the same order, a value can be calculated more accurately by calculating a value by using the expression (2) than by omitting the second term in the expression (2) as in the expression (3).

In a case where approximation of the expression (3) is used, for example, an LLR that is obtained when an error rate (bit error rate: BER) expected in a certain code is β, a probability that correction of a code word corrected with the number of correction bits α=1 is correct is 90%, and a probability that the correction is error correction is 10% can be calculated by the expression (1) as follows.

When the i-th bit is corrected from "1" to "0" LLR($b_i$)
=log(P($b_i$=0|$Y_{t=1}$)/P($b_i$=1|$Y_{t=1}$))=log 9=2.19

When the i-th bit is corrected from "0" to "1" LLR($b_i$)
=log(P($b_i$=0|$Y_{t=1}$)/P($b_i$=1|$Y_{t=1}$))=log (1/9)=−2.19

As described above, a symbol of the LLR is positive when a value of the corrected bit is "0", and a symbol of the LLR is negative when the value thereof is "0". Further, the same condition in which the number of correction bits t is 1 ($\alpha$=1) when this decoding result (code word Y) is obtained is used, and therefore absolute values indicating likelihood of the bit are equal regardless of the symbol of the LLR.

Similarly, a probability that correction is correctly performed when the number of correction bits is $\alpha$ at a BER ($\beta$) expected in advance can be calculated by simulation. That is, for example, a probability that correction of a code word is correct and a probability that the correction of a code word is error correction can be calculated by assuming a certain BER and the number of correction bits $\alpha$ and simulating error correction with respect to the nonvolatile memory 20 on which error bits are stored at random. Then, the LLR can be calculated by substituting those probabilities for the expression (1).

Depending on a type of the code used in the decoder 202a, the probability that the correction of the code word is correct and the probability that the correction is error correction can be calculated by using calculation expressions, instead of simulation. Herein, a calculation method of the LLR will be described by using an example where the decoder 202a uses an RS code.

In the RS code, a group of successive r bits constitutes a single symbol, and N symbols, i.e., a sequence of r×N bits constitutes a single code word. FIG. 6 illustrates an example of an RS code in which 8 bits (r=8) constitute a symbol. For simplicity, an RS code in which the number of correction symbols is one will be described herein.

A probability $P_{cor, \alpha=t}$ that a code word obtained as a result of decoding of an RS code and t-bit correction is correct is equal to a probability that only an error of one bit is included in the RS code word. $P_{cor, \alpha=t}$ is expressed by the following expression (5).

$$P_{cor, \alpha=t} = {}_NC_1 \times {}_rC_t \times \beta^t \times (1-\beta)^{Nr-t} \quad (5)$$

A probability $P_{mis, \alpha=1}$ that a code word obtained as a result of decoding of the RS code and one-bit correction ($\alpha$=1) is error correction is correctly obtained by summing up all probabilities corresponding to several patterns. That is, $P_{mis, \alpha=1}$ is expressed by the following expression (6).

$$P_{mis, \alpha=1} = P_{mis, \alpha=1, e=3} + P_{mis, \alpha=1, e=5} + P_{mis, \alpha=1, e=7} + \cdots \quad (6)$$

$P_{mis, \alpha=1, e=t}$ indicates a probability that, because errors of t bits are separately inserted into two or more symbols of the single code word, a wrong bit is corrected as a result of decoding of the RS code. Note that $P_{mis, e=t}$=coefficient×$\beta^t$×$(1-\beta)^{Nr-t}$ ($\beta \ll 1$) is satisfied, and therefore the smaller t is, the larger $P_{mis}$ is.

A probability $P_{mis, \alpha=2}$ that a code word obtained when $\alpha$=2 is satisfied, i.e., as a result of two-bit correction is error correction is expressed by the following expression (7).

$$P_{mis, \alpha=2} = P_{mis, \alpha=2, e=2} + P_{mis, \alpha=2, e=4} + P_{mis, \alpha=2, e=6} + \cdots \quad (7)$$

Similarly, in a case of $\alpha$=3 and 4, probabilities that a code word obtained as a result of correction is error correction are expressed by the following expressions (8) and (9), respectively.

$$P_{mis, \alpha=3} = P_{mis, \alpha=3, e=3} + P_{mis, \alpha=3, e=5} + P_{mis, \alpha=3, e=7} + \cdots \quad (8)$$

$$P_{mis, \alpha=4} = P_{mis, \alpha=4, e=4} + P_{mis, \alpha=4, e=6} + P_{mis, \alpha=4, e=8} + \cdots \quad (9)$$

The right sides in the expressions (6) to (9) can be approximate to a term in which a value of e is the smallest under the condition of (BER($\beta$))≪1). Therefore, for example, the expression (6) can be approximate to the probability $P_{mis, \alpha=1, e=3}$ in a case of t=3 serving as a pattern having the largest contribution in the right side, i.e., a pattern in which, although errors of three bits are included in the code word, only one bit is detected.

In this case, the expression (6) can be further deformed as in the following expression (10). Note that (N/2r) corresponds to contribution to error correction and detection caused by abbreviation of the RS code word.

$$P_{mis,\alpha=1} \approx P_{mis,\alpha=1,e=3} = (N/2r) \times {}_NC_2 \times {}_NC_1 \times {}_rP_2 \times \beta^3 \times (1-\beta)^{Nr-3} \quad (10)$$

The LLR for the RS code can be calculated by using the above-mentioned $P_{cor}$ and $P_{mis}$ instead of P($b_i$=0|$Y_{t=\alpha}$) and P($b_i$=1|$Y_{t=\alpha}$), respectively, in the expression (1).

FIG. 7 illustrates examples of calculation results of absolute values of LLRs, which are obtained at the time of one-bit correction when the number of bits in a symbol of the RS code is 8. N denotes the number of symbols. FIG. 7 illustrates examples obtained in a case of N=10, 15, 20, 25, and 30. BER denotes an error rate. FIG. 7 illustrates examples obtained in a case of BER=0.001, 0.002, 0.003, 0.004, 0.005, 0.006, 0.007, 0.008, 0.009, 0.01, and 0.0125. Although the values of the LLRs are expressed by decimals in FIG. 7, discretized values obtained by rounding the values to the nearest whole numbers may be used.

The LLR table for use in soft decision decoding is defined in advance by the vendor of the memory system 1 so that the LLR indicating likelihood of decoding performed by the decoder 202a calculated as described above is calculated when soft decision decoding is performed by the decoder 202b, and, at the time of decoding, the decoder 202a determines an index (HB, SB indexes) in this LLR table on the basis of a state of decoding. For example, the decoder 202a determines an index for each combination of the HB and the number of correction bits t of the decoder 202a as follows.

HB="0", t=1: index IDX1
HB="0", t=2: index IDX2
HB="0", t=3: index IDX3
HB="1", t=1: index IDX4
HB="1", t=2: index IDX5
HB="1", t=3: index IDX6

The indexes, which are associated with the values of the LLRs calculated as described above on the basis of the HB and the number of correction bits t, are defined for the indexes IDX1 to IDX6, respectively, by the vendor of the memory system 1. The indexes other than the HB correspond to SB indexes. Therefore, determining indexes includes determining SB indexes.

At the time of decoding, the decoder 202a determines an index corresponding to the HB obtained by hard decision decoding and the number of correction bits t on the basis of, for example, six indexes defined in advance by the vendor of the memory system 1 as described above. The decoder 202a writes values of the HB and the SB1 to SB4 corresponding to the determined index to the shared memory 17.

Figure 8:
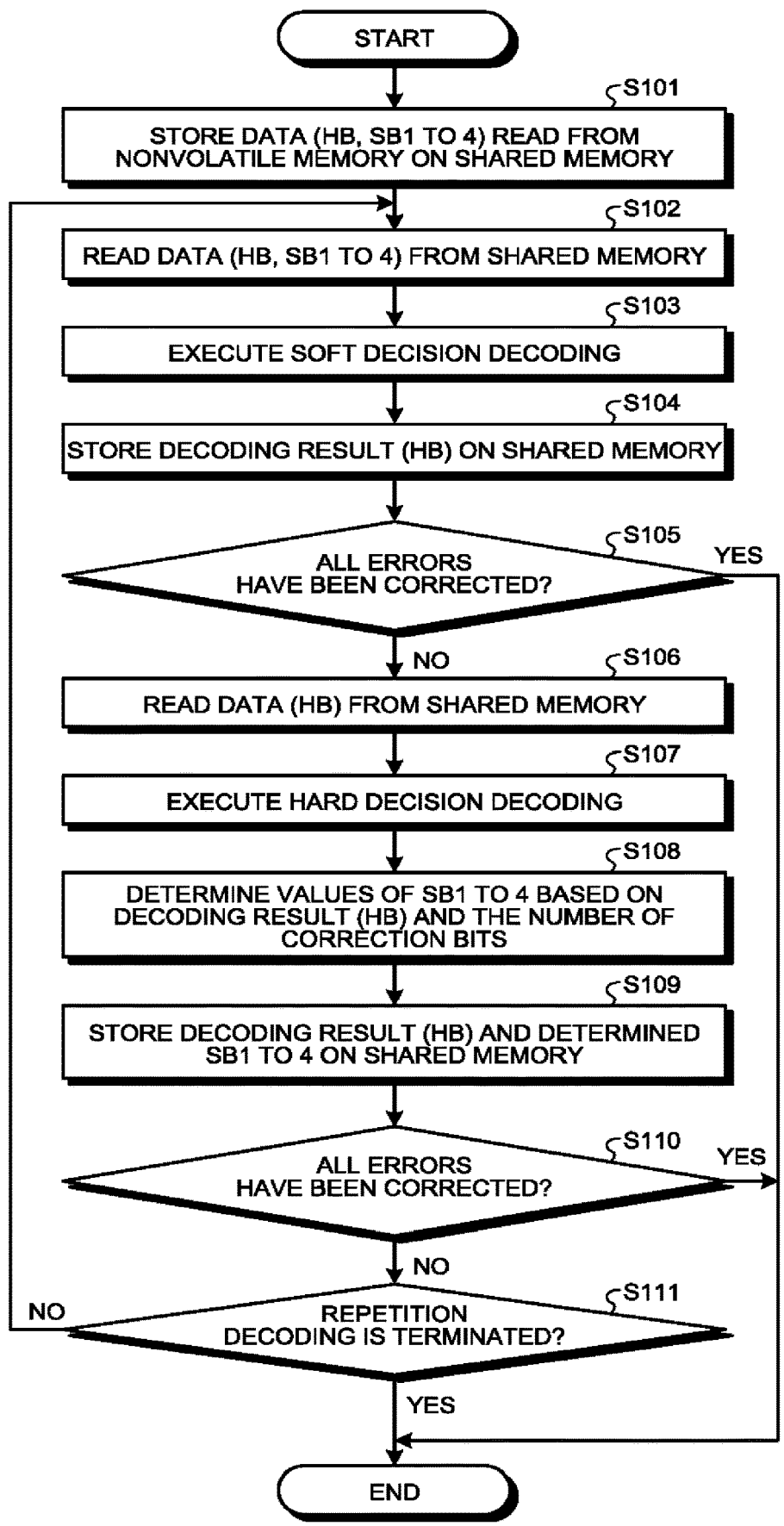
FIG. 8 is a flowchart illustrating an example of the repetition decoding process in the first embodiment.

Next, there will be described a flow of a repetition decoding process performed by the memory system 1 according to this embodiment configured as described above. FIG. 8 is a flowchart illustrating an example of the repetition decoding process in this embodiment.

In a case where a read request is issued from the host 30, the controller 11 instructs the memory I/F 13 to read data (user data and parity) from the nonvolatile memory 20. The read data is stored on the hared memory 17. In this embodiment, the memory I/F 13 writes an HB and SB1 to SB4 to the shared memory 17 (Step S101).

The decoder 202b reads the data (HB, SB1 to SB4) for use in soft decision decoding from the shared memory 17 (Step S102). The decoder 202b executes soft decision decoding with respect to the read data (Step S103). The decoder 202a stores an HB serving as a result of soft decision decoding on the shared memory 17 (Step S104).

The encoding/decoding unit 14 determines whether all errors have been corrected (Step S105). In a case where ail the errors have been corrected (Step S105: Yes), the repetition decoding process is terminated.

In a case where not all the errors have been corrected (Step S105: No), the decoder 202a reads the data (HB) for use in hard decision decoding from the shared memory 17 (Step S106). The decoder 202a executes hard decision decoding with respect to the read data (Step S107). The decoder 202a determines values of the SB indexes SB1 to SB4) on the basis of the HB serving as the decoding result and the number of correction bits corrected by the hard decision decoding (Step S108). The decoder 202a stores the HB serving as the decoding result and the determined SB indexes (SB1 to SB4) on the shared memory 17 (Step S109).

The encoding/decoding unit 14 determines whether all the errors have been corrected (Step S110). In a case where all the errors have been corrected (Step S110: Yes), the repetition decoding process is terminated.

In a case where not all the errors have been corrected (Step S110: No), the encoding/decoding unit 14 determines whether to terminate the repetition decoding (Step S111). The encoding/decoding unit 14 determines that, for example, the repetition decoding is terminated in a case where the number of times of repetition decoding reaches an upper limit number (M times) set in advance. In a case where the repetition decoding is not terminated (Step S111: No), the process returns to Step S102, and the process is repeated. In a case where the encoding/decoding unit 14 determines that the repetition decoding is terminated (Step S111: Yes), the encoding/decoding unit 14 terminates the repetition decoding process.

In the memory system according to this embodiment, an SB-index arithmetic unit having a function of determining SB indexes may be included in the shared memory 17. In the memory system according to this embodiment, hereinafter, description will be made on the assumption that the SB-index arithmetic unit in the shared memory 17 has a function of determining SB indexes. First, the decoder 202a provides the HB serving as the decoding result of the hard decision decoding and the number of correction bits to the SB-index arithmetic unit of the shared memory 17. The SB-index arithmetic unit determines values of SB indexes (SB1 to SB4) on the basis of the HB and the number of correction bits received from the decoder 202a. The SB-index arithmetic unit stores the determined values of the SB indexes in a storage area of the shared memory 17.

As described above, according to this embodiment, it is possible to obtain not only a decoding result of hard decision decoding (binary information of one bit) but also index information for calculating likelihood of the decoding on the basis of the decoding result and reflect the obtained information to input of the next soft decision decoding. Therefore, it is possible to improve correction ability of soft decision decoding.

Second Embodiment

In the first embodiment, index information (SB indexes) is determined on the basis of a decoding result (HB) and the number of correction bits. In a second embodiment, SB indexes are determined also in consideration of an absolute value γ of an original LLR of a corrected bit. That is, in this embodiment, the number of correction bits and the absolute value γ of the original LLR are used as a state of hard decision decoding. The original LLR is an LLR calculated by using SB1 to SB4 that are stored on the shared memory 17 when reading from the nonvolatile memory 20 is performed.

Figure 9:
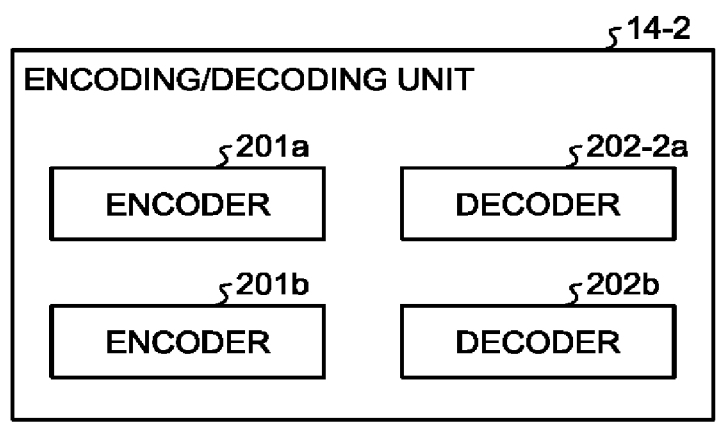
FIG. 9 is a block diagram illustrating an example of a functional configuration of an encoding/decoding unit according to a second embodiment.

FIG. 9 is a block diagram illustrating an example of a functional configuration of an encoding/decoding unit 14-2 in the second embodiment. Note that a schematic configuration of a memory system according to the second embodiment is similar to the schematic configuration of the memory system in the first embodiment illustrated in FIG. 1 except for the encoding/decoding unit 14-2, and therefore description thereof will be omitted.

As illustrated in FIG. 9, the encoding/decoding unit 14-2 includes encoders 201a and 201b and decoders 202-2a and 202b. In the second embodiment, a function of the decoder 202-2a is different from that of the decoder 202a in the first embodiment. Other functions are similar to those in the first embodiment, and therefore the functions are denoted by the same reference signs, and description thereof will be omitted.

The decoder 202-2a determines SB indexes on the basis of not only a decoding result (HB) and the number of correction bits but also an absolute value γ of an original LLR of the corrected bit. For example, SB1 to SB4 obtained when reading from the nonvolatile memory 20 is performed are stored in an area of the shared memory 17, the area being different from a storage area for SB1 to SB4 that are updated in repetition decoding, and the decoder 202-2a calculates the original LLR on the basis of the SB1 to SB4 stored in the area and an LLR table (stored on the shared memory 17, for example). For example, the original LLR may be calculated by using the SB1 to SB4 obtained when reading from the nonvolatile memory 20 is performed, be stored on the shared memory 17, and be referred to in the decoder 202-2a.

Hereinafter, details of a procedure for determining SB indexes will be described. In this embodiment, an LLR obtained after the i-th bit is decoded is expressed by the following expression (11). Note that abs(LLR) denotes an absolute value of the LLR.

$$LLR(b_i) = \log(P(b_i=0|Y_{t=\alpha,\ abs(LLR)=\gamma})/P(b_i=1|Y_{t=\alpha,\ abs(LLR)=\gamma})) \quad (11)$$

In the first embodiment, a probability that correction of a code word corrected with the number of correction bits α is correct and a probability that the correction is error correction when an error rate (BER) expected in a certain code is β are obtained in advance by simulation. In the second embodiment, a probability that correction is correct and a probability that the correction is error correction when an expected error rate (BER) is β and an absolute value of an LLR of a bit corrected with the number of correction bits α is γ are calculated by simulation.

The smaller the absolute value of the LLR read from the nonvolatile memory 20 (the absolute value of the LLR determined by using the LLR table on the basis of the values of the indexes, to be exact) is, the higher a probability that a target bit is an error is, and therefore the decoded LLR has a large value. On the contrary, the larger the absolute value of the LLR read from the nonvolatile memory 20 is, the lower a probability that the target bit is an error is, and therefore the absolute value of the decoded LLR is small.

Therefore, the decoder 202-2a determines values of indexes as follows, for example, on the basis of the HB serving as a result of hard decision decoding performed by the decoder 202-2a, the number of correction bits α performed at the time of the hard decision decoding, and the absolute value γ of the original LLR.

HB="0", t=1, γ<3: index IDX1
HB="0", t=1, γ≥3: index IDX2
HB="0", t=2, γ<3: index IDX3
HB="0", t=2, γ≥3: index IDX4
HB="1", t=1, γ<3: index IDX5
HB="1", t=1, γ≥3: index IDX6
HB="1", t=2, γ<3: index IDX7
HB="1", t=2, γ≥3: index IDX8

As described above, the decoder 202-2a may determine different indexes for respective combinations of the HB, the number of correction bits t, and a range including the absolute value γ of the original LLR. A condition of the range and the number of indexes are not limited to the above-mentioned examples. For example, a value indicating a boundary of the range is not limited to "3" and may be another value. Further, a condition of a range of 3 or more may be used, such as γ<3, 3≤γ≤5, and 5<γ. In this case, twelve indexes for twelve combinations in total may be used on the basis of values of the HB (0 or 1) and the number of correction bits t (1 or 2). The value of the LLR may be integrated on the basis of the number of usable indexes. For example, in a case where eight indexes are unused and twelve indexes cannot be allotted, the twelve indexes may be used by being integrated into the above-mentioned eight indexes.

Figure 10:
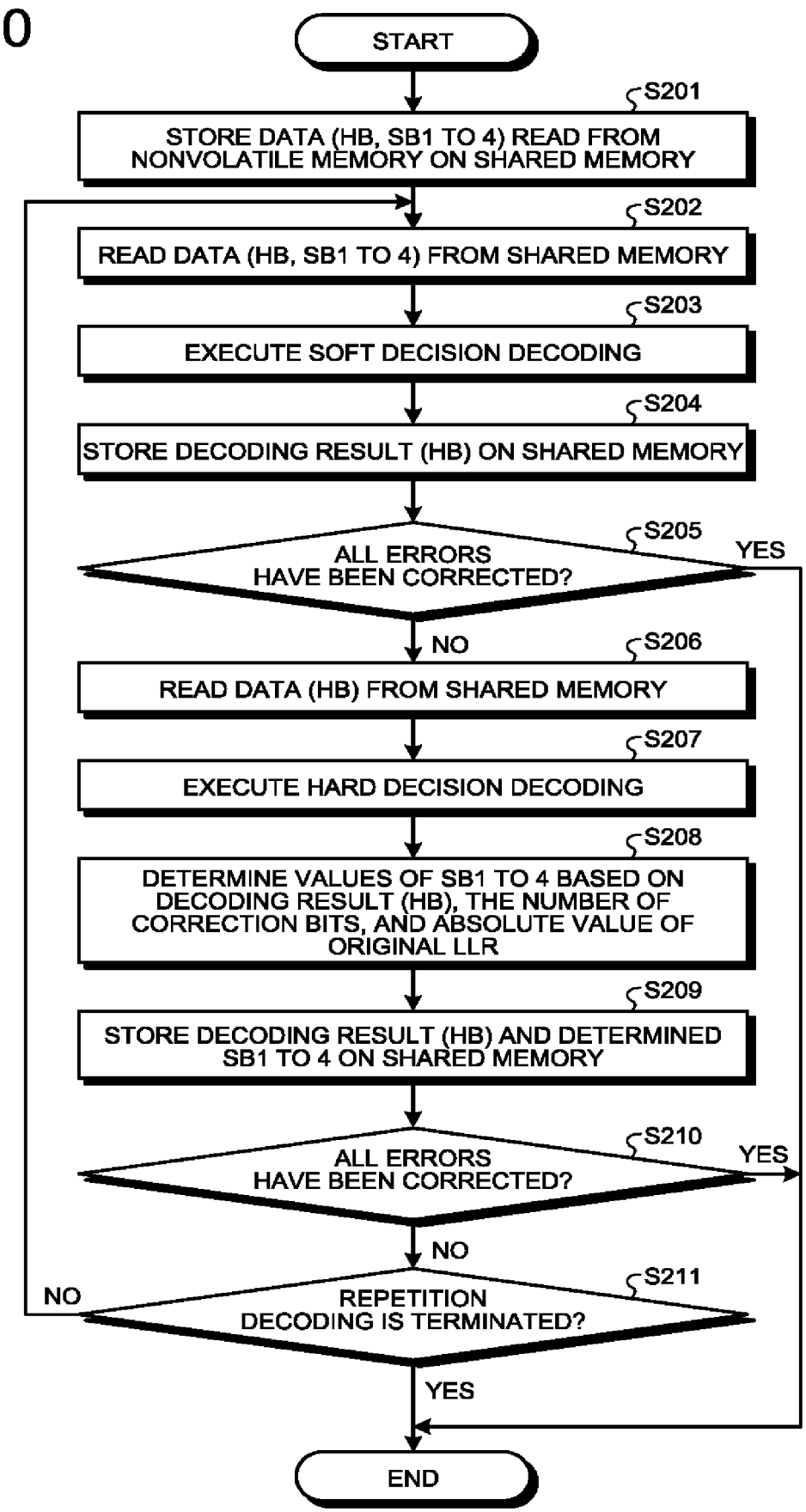
FIG. 10 is a flowchart illustrating an example of a repetition decoding process in the second embodiment.

Next, there will be described a flow of a repetition decoding process performed by the memory system 1 according to this embodiment configured as described above. FIG. 10 is a flowchart illustrating an example of the repetition decoding process in this embodiment.

In this embodiment, a process in Step S208 is different from Step S108 in FIG. 8 illustrating the flow of the repetition decoding process in the first embodiment. Step S201, Step S202, Step S203, Step S204, Step S205, Step S206, Step S207, Step S209, Step S210, and Step S211 are similar to Step S101, Step S102, Step S103, Step S104, Step S105, Step S106, Step S107, Step S109, Step S110, and Step S111, respectively, in FIG. 8 illustrating the flow of the repetition decoding process in the first embodiment, and therefore description thereof will be omitted.

In Step S208, the decoder 202-2a determines values of SB indexes (SB1 to SB4) on the basis of an HB serving as a decoding result, the number of correction bits performed by hard decision decoding, and an absolute value of an original LLR of a correction bit (Step S208).

In the memory system according to this embodiment, an SB-index arithmetic unit having a function of determining SB indexes may be included in the shared memory 17. In the memory system according to this embodiment, hereinafter, description will be made on the assumption that the SB-index arithmetic unit in the shared memory 17 has a function of determining SB indexes. First, the decoder 202-2a provides the HB serving as the decoding result of the hard decision decoding and correction information (the number of correction bits, a position of a correction bit, and the like) to the SB-index arithmetic unit of the shared memory 17. The SB-index arithmetic unit calculates the original LLR on the basis of an LLR table and original SB1 to SB4. The SB-index arithmetic unit determines values of SB indexes (SB1 to SB4) on the basis of the HB and the number of correction bits received from the decoder 202-2a and a calculated absolute value of the original LLR. The SB-index arithmetic unit stores the determined values of the SB indexes in a storage area of the shared memory 17.

As described above, according to this embodiment, indexes for calculating an LLR are determined in consideration of not only a decoding result and the number of correction bits but also an original LLR of a correction bit. Therefore, it is possible to calculate an LLR accurately, as compared to the first embodiment.

Third Embodiment

In a third embodiment, an incremental Euclidian distance (IED) serving as an index indicating likelihood of decoding is used instead of an absolute value γ of an original LLR used in the second embodiment. That is, in this embodiment, the IED is used as a state of hard decision decoding. The IED indicates, for example, a sum of absolute values of original LLRs of all correction bits obtained when a code word Y serving as a decoding result is obtained.

Figure 11:
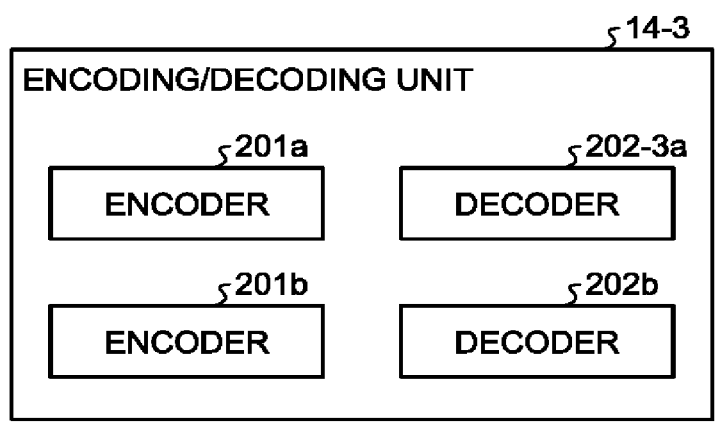
FIG. 11 is a block diagram illustrating an example of a functional configuration of an encoding/decoding unit according to a third embodiment.

FIG. 11 is a block diagram illustrating an example of a functional configuration of an encoding/decoding unit 14-3 in the third embodiment. Note that a schematic configuration of a memory system according to the third embodiment is similar to the schematic configuration of the memory system in the first embodiment illustrated in FIG. 1 except for the encoding/decoding unit 14-3, and therefore description thereof will be omitted.

As illustrated in FIG. 11, the encoding/decoding unit 14-3 includes encoders 201a and 201b and decoders 202-3a and 202b. In the third embodiment, a function of the decoder 202-3a is different from that of the decoder 202a in the first embodiment. Other functions are similar to those in the first embodiment, and therefore the functions are denoted by the same reference signs, and description thereof will be omitted.

The decoder 202-3a determines SB indexes on the basis of not only a decoding result (HB) but also a value ω of the IED. For example, SB1 to SB4 obtained when reading from the nonvolatile memory 20 is performed are stored in an area of the shared memory 17, the area being different from a storage area for SB1 to SB4 that are updated in repetition decoding, and the decoder 202-3a calculates the original LLR of each of one or more correction bits on the basis of the SB1 to SB4 stored in the area and an LLR table (stored in the shared memory 17, for example). Further, the decoder 202-3a calculates a sum of the absolute values of the LLRs calculated for the respective correction bits as the value ω of the IED.

In this embodiment, an LLR obtained after the i-th bit is decoded is expressed by the following expression (12). The expression (12) expresses an LLR obtained after each bit is decoded, where an IED ($Y_{IED}$) for the decoded code word Y is ω.

$$LLR(b_i)=\log(P(b_i=0|Y_{IED}=\omega)/P(b_i=1|Y_{IED}=\omega)) \quad (12)$$

In this embodiment, a probability that correction is correct and a probability that correction is error correction when an expected error rate (BER) is β and a value of the IED is ω are obtained by simulation.

The larger the number of correction bits t is, the larger the value of the IED is, and the larger the absolute value of the LLR of the correction bit is, the larger the value of the IED is. That is, the smaller the IED is, the higher reliability of the code word Y is, and therefore the absolute value of the corrected LLR is large. Further, the larger the IED is, the lower the reliability of the code word Y is, and therefore the absolute value of the corrected LLR is small.

Therefore, the decoder 202-3a determines values of indexes as follows, for example, on the basis of the HB serving as a result of hard decision decoding performed by the decoder 202-3a and the value ω of the IED.

HB="0", IED≤1: index IDX1
HB="0", 1<IED≤3: index IDX2
HB="0", 3<IED≤5: index IDX3
HB="0", 5<IED≤9: index IDX4
HB="0", 9<IED: index IDX5
HB="1", IED≤1: index IDX6
HB="1", 1<IED≤3: index IDX7
HB="1", 3<IED≤5: index IDX8
HB="1", 5<IED≤9: index IDX9
HB="1", 9<IED: index IDX10

As described above, the decoder 202-3a may determine different indexes for respective combinations of the HB and a range including the value ω of the IED. A condition of the range and the number of indexes are not limited to the above-mentioned examples. Further, as in the second embodiment, the value of the LLR may be integrated on the basis of the number of usable indexes.

Figure 12:
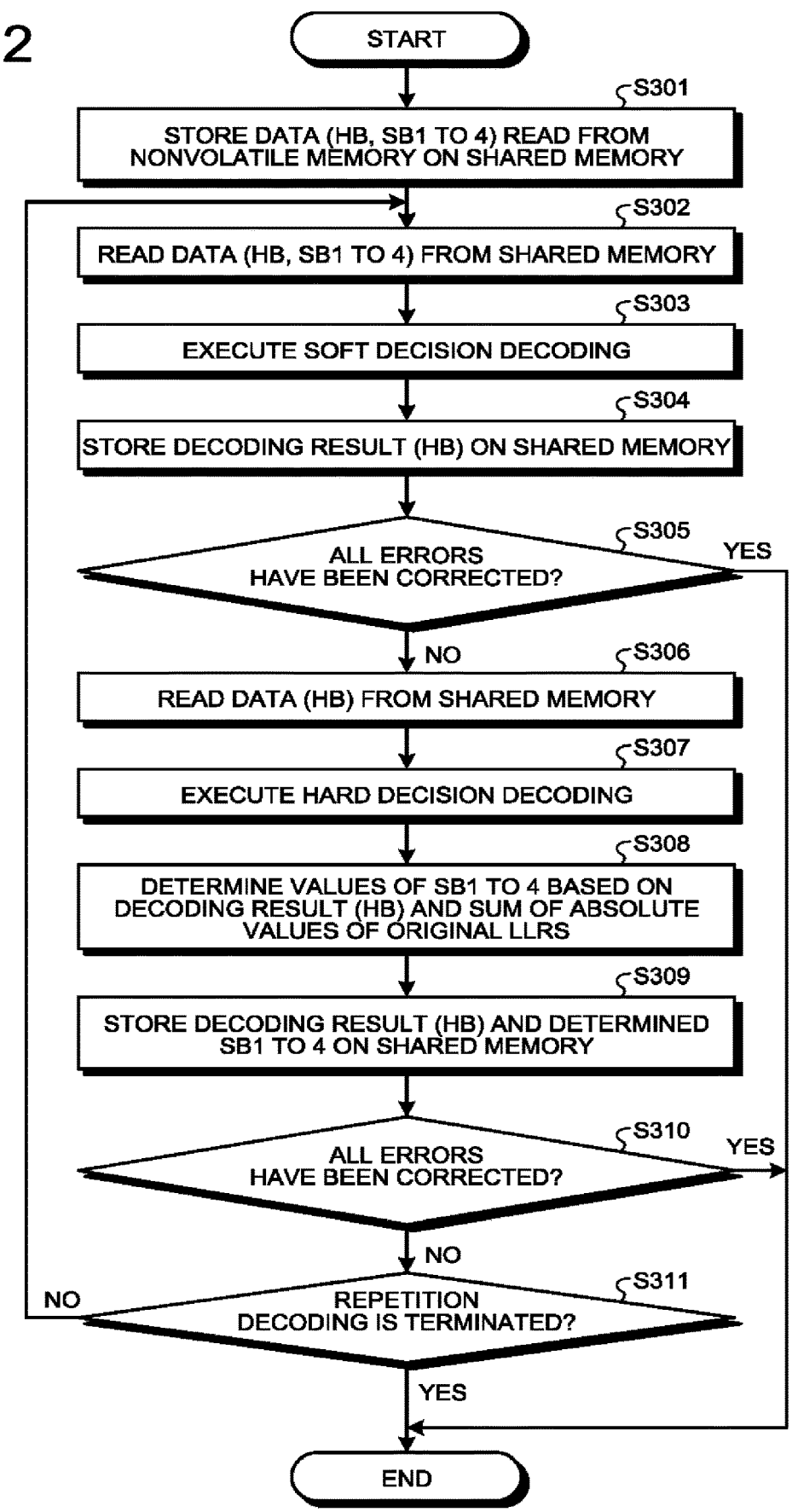
FIG. 12 is a flowchart illustrating an example of a repetition decoding process in the third embodiment.

Next, there will be described a flow of a repetition decoding process performed by the memory system 1 according to this embodiment configured as described test above. FIG. 12 is a flowchart illustrating an example of the repetition decoding process in this embodiment.

In this embodiment, a process in Step S308 is different from Step S108 in FIG. 8 illustrating the flow of the repetition decoding process in the first embodiment. Step S301, Step S302, Step S303, Step S304, Step S305, Step S306, Step S307, Step S309, Step S310, and Step S311 are similar to Step S101, Step S102, Step S103, Step S104, Step S105, Step S106, Step S107, Step S109, Step S110, and Step S111, respectively, in FIG. 8 illustrating the flow of the repetition decoding process in the first embodiment, and therefore description thereof will be omitted.

In Step S309, the decoder 202-3a determines values of SB indexes (SB1 to SB4) on the basis of an HB serving as a decoding result and a value ω of the IED that is a sum of absolute values of original LLRs (Step S308).

In the memory system according to this embodiment, an SB-index arithmetic unit having a function of determining SB indexes may be included in the shared memory 17. In the memory system according to this embodiment, hereinafter, description will be made on the assumption that the SB-index arithmetic unit in the shared memory 17 has a function of determining SB indexes. First, the decoder 202-3a provides the HB serving as the decoding result of the hard decision decoding and correction information (the number of correction bits, a position of a correction bit, and the like) to the SB-index arithmetic unit of the shared memory 17. The SB-index arithmetic unit calculates the original LLR of each of one or more corrections bits on the basis of an LLR table and original SB1 to SB4. The SB-index arithmetic unit calculates a sum of absolute values of the LLRs calculated for the respective correction bits as the value ω of the IED. The SB-index arithmetic unit determines values of SB indexes (SB1 to SB4) on the basis of the HB received from the decoder 202-3a and the calculated value ω of the IED. The SB-index arithmetic unit stores the determined values of the SB indexes in a storage area of the shared memory 17.

As described above, according to this embodiment, indexes for calculating an LLR are determined in consideration of not only a decoding result but also a sum (IED) of absolute values of original LLRs of correction bits. Therefore, it is possible to calculate an LLR accurately, as compared to the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a nonvolatile memory;
a memory controller configured to control the nonvolatile memory,
store a multi-dimensional error correction code in the nonvolatile memory, the multi-dimensional error correction code including at least one symbol that is capable of being protected by at least a first component code and a second component code,
read the multi-dimensional error correction code from the nonvolatile memory,
execute hard decision decoding of the first component code with respect to the read multi-dimensional error correction code,
output a first decoding result serving as a result of the hard decision decoding and index information for calculating likelihood of the first decoding result,
execute, in a case where the hard decision decoding fails, soft decision decoding of the second component code by using the first decoding result and the index information,
output a result of the soft decision decoding as a hard bit, and, and
execute, in a case where the soft decision decoding fails, the hard decision decoding with respect to the output result of the soft decision decoding serving as data corresponding to the first component code.

2. The memory system according to claim 1, wherein the memory controller is configured to determine the index information on the basis of the first decoding result and a number of bits corrected in the first decoding result.

3. The memory system according to claim 1, wherein the memory controller is configured to determine the index information on the basis of the first decoding result, a number of bits corrected in the first decoding result, and likelihood of a value of an original bit of the corrected bit.

4. The memory system according to claim 3, wherein
the memory controller is configured to determine a different piece of the index information for each combination of the first decoding result, the number of bits corrected in the first decoding result, and a range including a value of the likelihood.

5. The memory system according to claim 1, wherein
the memory controller is configured to determine the index information on the basis of the first decoding result and a sum of likelihood of values of original bits of one or more corrected bits.

6. The memory system according to claim 5, wherein
the memory controller is configured to determine a different piece of the index information for each combination of the first decoding result and a range including a value of the sum.

7. The memory system according to claim 1, wherein
the memory controller is configured to
obtain the likelihood corresponding to the first decoding result and the index information by using correspondence information in which the first decoding result and the index information are associated with likelihood of the first decoding result, and
execute soft decision decoding of the second component code by using the obtained likelihood.

8. The memory system according to claim 1, wherein: the multi-dimensional error correction code is a two-dimensional error correction code protected by the first component code and the second component code; and the memory controller is configured to execute the hard decision decoding in a case where the soft decision decoding fails.

9. The memory system according to claim 1, wherein
the memory controller is configured to transmit data decoded by the hard decision decoding or the soft decision decoding to a host that has requested reading of data.

10. The memory system according to claim 1, wherein:
the memory controller includes a shared memory configured to store the first decoding result and the result of the soft decision decoding; and
the shared memory is configured to determine the index information on the basis of the first decoding result.

11. The memory system according to claim 1, wherein:
the memory controller includes a shared memory configured to store data read from the nonvolatile memory, and overwrite the first decoding result and the result of the soft decision decoding; and the shared memory is configured to determine the index information on the basis of the first decoding result.

12. A method of controlling a nonvolatile memory, comprising:
storing, in the nonvolatile memory, a multi-dimensional error correction code, the multi-dimensional error correction code including at least one symbol that is capable of being protected by at least a first component code and a second component code;
reading the multi-dimensional error correction code from the nonvolatile memory;
executing hard decision decoding of the first component code with respect to the read multi-dimensional error correction code and outputting a first decoding result serving as a result of the hard decision decoding and index information for calculating likelihood of the first decoding result;
executing, in a case where the hard decision decoding fails, soft decision decoding of the second component code by using the first decoding result and the index information and outputting a result of the soft decision decoding as a hard bit; and
executing, in a case where the soft decision decoding fails, the hard decision decoding with respect to the output result of the soft decision decoding serving as data corresponding to the first component code.

13. The method according to claim 12, further comprising determining the index information on the basis of the first decoding result and a number of bits corrected in the first decoding result.

14. The method according to claim 12, further comprising determining the index information on the basis of the first decoding result, a number of bits corrected in the first decoding result, and likelihood of a value of an original bit of the corrected bit.

15. The method according to claim 14, further comprising determining a different piece of the index information for each combination of the first decoding result, the number of bits corrected in the first decoding result, and a range including a value of the likelihood.

16. The method according to claim 12, further comprising determining the index information on the basis of the first decoding result and a sum of likelihood of values of original bits of one or more corrected bits.

17. The method according to claim 16, further comprising determining a different piece of the index information for each combination of the first decoding result and a range including a value of the sum.

18. The method according to claim 12, further comprising obtaining the likelihood corresponding to the first decoding result and the index information by using correspondence information in which the first decoding result and the index information are associated with likelihood of the first decoding result and executing soft decision decoding of the second component code by using the obtained likelihood.

19. The method according to claim 12, wherein: the multi-dimensional error correction code is a two-dimensional error correction code protected by the first component code and the second component code; and the method includes further executing the hard decision decoding in a case where the soft decision decoding fails.

20. The method according to claim 12, further comprising transmitting data decoded by the hard decision decoding or the soft decision decoding to a host that has requested reading of data.

* * * * *